(12) United States Patent
Kawano et al.

(10) Patent No.: US 11,696,456 B2
(45) Date of Patent: Jul. 4, 2023

(54) SOLAR CELL

(71) Applicant: Panasonic Intellectual Property Management Co., Ltd., Osaka (JP)

(72) Inventors: Kenji Kawano, Osaka (JP); Taisuke Matsui, Osaka (JP); Akio Matsushita, Osaka (JP); Maki Hiraoka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/664,428

(22) Filed: May 23, 2022

(65) Prior Publication Data

US 2022/0285640 A1 Sep. 8, 2022

Related U.S. Application Data

(63) Continuation of application No. PCT/JP2020/027082, filed on Jul. 10, 2020.

(30) Foreign Application Priority Data

Dec. 24, 2019 (JP) .................. 2019-233476

(51) Int. Cl.
*H10K 30/15* (2023.01)
*H01G 9/20* (2006.01)
(Continued)

(52) U.S. Cl.
CPC ......... *H10K 30/151* (2023.02); *H01G 9/2059* (2013.01); *H10K 30/85* (2023.02); *H10K 30/86* (2023.02)

(58) Field of Classification Search
CPC ...... H10K 30/151; H10K 30/85; H10K 30/86; H10K 30/353; H01G 9/2059
See application file for complete search history.

(56) References Cited

U.S. PATENT DOCUMENTS 6,310,282 B1 * 10/2001 Sakurai ............... H10K 30/151
429/111
7,462,774 B2 * 12/2008 Roscheisen ............ H10K 30/87
257/E31.032
(Continued)

FOREIGN PATENT DOCUMENTS

EP 3712967 A1 9/2020
GB 2451108 A * 1/2009 ............. B82Y 10/00
(Continued)

OTHER PUBLICATIONS

International Search Report of PCT application No. PCT/JP2020/027082 dated Sep. 8, 2020.
(Continued)

*Primary Examiner* — Golam Mowla
(74) *Attorney, Agent, or Firm* — Greenblum & Bernstein, P.L.C.

(57) ABSTRACT

A solar cell 100 includes a substrate 1, a first electrode 6, an electron transport layer 2, a first photoelectric conversion layer 3, and a coating layer 5. The first photoelectric conversion layer 3 is disposed between the first electrode 6 and the substrate 1. The substrate 1 has a first main surface and a second main surface, and the second main surface has an uneven structure. The electron transport layer 2 has a first main surface and a second main surface, and the first main surface and the second main surface each have an uneven structure. The first photoelectric conversion layer 3 has a first main surface and a second main surface. The second main surface of the substrate 1 faces the first main surface of the electron transport layer 2.

14 Claims, 9 Drawing Sheets

(51) Int. Cl.
*H10K 30/86* (2023.01)
*H10K 30/85* (2023.01)

(56) References Cited

U.S. PATENT DOCUMENTS

| | | | | |
|---|---|---|---|---|
| 8,067,763 | B2 * | 11/2011 | Wang | H10K 30/151 257/E51.015 |
| 8,455,757 | B2 * | 6/2013 | Wang | H10K 30/211 136/265 |
| 2008/0092946 | A1 * | 4/2008 | Munteanu | H10K 30/151 136/252 |
| 2010/0313953 | A1 * | 12/2010 | Zook | H01G 9/2031 977/948 |
| 2010/0326499 | A1 * | 12/2010 | Liu | H10K 30/87 136/252 |
| 2011/0108102 | A1 * | 5/2011 | Wang | H10K 30/151 257/E51.012 |
| 2011/0114156 | A1 * | 5/2011 | Coakley | H01L 27/1421 438/73 |
| 2012/0298175 | A1 * | 11/2012 | Van Roosmalen | H01L 31/03529 438/66 |
| 2013/0319515 | A1 * | 12/2013 | Yamazaki | H01L 31/022466 438/85 |
| 2016/0149149 | A1 | 5/2016 | Shinotsuka et al. | |
| 2017/0372847 | A1 * | 12/2017 | Satou | H10K 30/82 |
| 2018/0019360 | A1 | 1/2018 | Mishima et al. | |
| 2018/0174761 | A1 | 6/2018 | Kamino et al. | |
| 2019/0362905 | A1 | 11/2019 | Kusumoto | |
| 2021/0175450 | A1 | 6/2021 | Kim et al. | |

FOREIGN PATENT DOCUMENTS

| | | | |
|---|---|---|---|
| JP | 2008-159721 | 7/2008 | |
| JP | 2013-254912 | 12/2013 | |
| JP | 2014-011054 | 1/2014 | |
| JP | 2015-119102 | 6/2015 | |
| JP | 2016-178295 | 10/2016 | |
| JP | 2017-066096 | 4/2017 | |
| JP | 2018-518845 | 7/2018 | |
| JP | 2019-175917 | 10/2019 | |
| JP | 2019-208010 | 12/2019 | |
| WO | WO-9945595 A2 * | 9/1999 | C07C 17/12 |
| WO | WO-2005020335 A1 * | 3/2005 | H01L 31/0392 |
| WO | WO-2011013775 A1 * | 2/2011 | C23C 16/407 |
| WO | WO-2014109355 A1 * | 7/2014 | C09D 11/322 |
| WO | 2014/208713 | 12/2014 | |
| WO | 2015/184197 A2 | 12/2015 | |
| WO | 2016/157979 | 10/2016 | |
| WO | 2019/098527 A1 | 5/2019 | |

OTHER PUBLICATIONS

Julian Burschka et al., "Sequential deposition as a route to high-performance perovskite-sensitized solar cells", Nature, vol. 499, Jul. 10, 2013, pp. 316-319 [DOI:10.1038/nature12340].

Taisuke Matsui et al., "Room-Temperature Formation of Highly Crystalline Multication Perovskites for Efficient, Low-Cost Solar Cells", Advanced Materials, vol. 29, Issue 15, Jan. 20, 2017, 1606258 [DOI:10.1002/adma.201606258].

The EPC Office Action from European Patent Office (EPO) dated May 9, 2023 for the related European Patent Application No. 20905777.7.

* cited by examiner

PROTRUSION OF UNEVENNESS

RECESS OF UNEVENNESS

SOLAR CELL

BACKGROUND

1. Technical Field

The present disclosure relates to solar cells.

2. Description of the Related Art

Organic photovoltaics or perovskite solar cells have recently been studied and developed as new solar cells replacing existing silicon solar cells.

Perovskite solar cells use, as photoelectric conversion materials, perovskite compounds represented by chemical formula $ABX_3$ (wherein A is a monovalent cation, B is a divalent cation, and X is a halogen anion).

Non-Patent Literature 1 (Julian Burschka et al., "Sequential deposition as a route to high-performance perovskite-sensitized solar cells", Nature, vol. 499, pp. 316-319, 18 Jul. 2013 [DOI:10.1038/nature12340]) discloses a perovskite solar cell that includes, as a photoelectric conversion material for perovskite solar cells, a perovskite compound represented by chemical formula $CH_3NH_3PbI_3$ (hereinafter referred to as "$MAPbI_3$"). In the perovskite solar cell disclosed in Non-Patent Literature 1, the perovskite compound represented by $MAPbI_3$, $TiO_2$, and Spiro-OMeTAD are used as a photoelectric conversion material, an electron transport material, and a hole transport material, respectively.

Non-Patent Literature 2 (Taisuke Matsui et al., "Room-Temperature Formation of Highly Crystalline Multication Perovskites for Efficient, Low-Cost Solar Cells", Advanced Materials, Volume 29, Issue 15, Apr. 18, 2017, 1606258 [DOI: 10.1002/adma.201606258]) discloses a perovskite solar cell that includes, as a photoelectric conversion material for perovskite solar cells, a multi-cation perovskite compound containing $CH_3NH_3^+$ (hereinafter referred to as "MA"), $CH(NH_2)_2^+$ (hereinafter referred to as "FA"), and Cs as monovalent cations. In the perovskite solar cell disclosed in Non-Patent Literature 2, the multi-cation perovskite compound, $TiO_2$, and Spiro-OMeTAD are used as a photoelectric conversion material, an electron transport material, and a hole transport material, respectively.

Patent Literature 1 (WO 2014/208713) discloses an organic photovoltaic. The organic photovoltaic disclosed in Patent Literature 1 has an uneven fine structure at the interface between a photoelectric conversion layer and an electrode. With this configuration, the organic photovoltaic disclosed in Patent Literature 1 can improve the photoelectric energy conversion efficiency.

SUMMARY

One non-limiting and exemplary embodiment provides a perovskite solar cell having a high voltage and including a photoelectric conversion layer on a surface having an uneven structure.

In one general aspect, the techniques disclosed here feature a solar cell including a substrate, a first electrode, an electron transport layer, a first photoelectric conversion layer, and a coating layer. The first photoelectric conversion layer is disposed between the first electrode and the substrate. The substrate has a first main surface and a second main surface, and the second main surface of the substrate has an uneven structure. The electron transport layer has a first main surface and a second main surface, and the first main surface and the second main surface of the electron transport layer each have an uneven structure. The first photoelectric conversion layer has a first main surface and a second main surface. The second main surface of the substrate faces the first main surface of the electron transport layer. The second main surface of the electron transport layer faces the first main surface of the first photoelectric conversion layer. The second main surface of the electron transport layer has a first region not covered by the first photoelectric conversion layer and a second region covered by the first photoelectric conversion layer. The first photoelectric conversion layer contains a perovskite compound. The first region is covered by the coating layer. The coating layer contains an oxide semiconductor.

The present disclosure provides a perovskite solar cell having a high voltage and including a photoelectric conversion layer on a surface having an uneven structure.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Definition of Terms

Figure 1A:
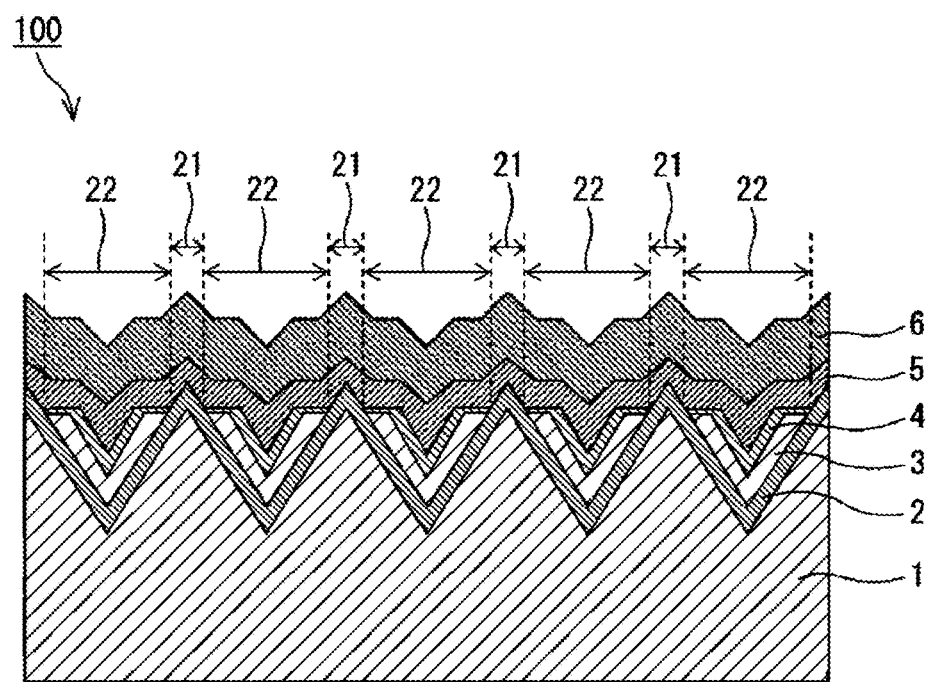
FIG. 1A is a cross-sectional view of a solar cell according to a first embodiment.

The term "perovskite compound" as used herein refers to a perovskite crystal structure represented by chemical formula $ABX_3$ (wherein A is a monovalent cation, B is a divalent cation, and X is a halogen anion) and a similar crystal structure.

The term "perovskite solar cell" as used herein refers to a solar cell including a perovskite compound as a photoelectric conversion material.

The term "lead perovskite compound" as used herein refers to a lead-containing perovskite compound.

The term "lead perovskite solar cell" as used herein refers to a solar cell including a lead perovskite compound as a photoelectric conversion material.

Underlying Knowledge Forming Basis of the Present Disclosure

The underlying knowledge forming the basis of the present disclosure will be described below.

Perovskite compounds have characteristic physical properties, such as high optical absorption coefficient and long diffusion length. Due to such physical properties, perovskite solar cells with a thickness of several hundreds of nanometers can generate power at high efficiency. In addition, perovskite solar cells use fewer materials than those in existing silicon solar cells, do not require high temperature during formation, and can be formed by coating. Having such characteristics, perovskite solar cells are light in weight and can be formed on a substrate formed of a flexible material, such as a plastic. Accordingly, perovskite solar cells can be placed on areas with weight limits. For example, perovskite solar cells can be developed into building-integrated solar cells in combination with existing members, such as building materials. To produce such a perovskite solar cell in combination with a building material, a perovskite solar cell needs to be formed on a substrate composed of a member having a relatively large uneven structure on the surface.

To further improve the photoelectric conversion efficiency, a multi-junction solar cell including a perovskite solar cell and a silicon solar cell stacked on top of each other, that is, a tandem solar cell, has been studied. The silicon solar cell may have a texture structure with an uneven surface in order to effectively use incident light. When the silicon solar cell has a texture structure, the perovskite solar cell thus needs to be formed on the surface having an uneven structure.

However, a photoelectric conversion layer, that is, a perovskite compound-containing layer, in the perovskite solar cell has a small thickness and is formed by coating. For this, in the case where the photoelectric conversion layer in the perovskite solar cell is formed on the surface having an uneven structure, the photoelectric conversion layer conforms to the shape of the uneven structure and cannot fully cover the unevenness. In particular, the photoelectric conversion layer cannot fully cover the tops of protrusions and the surrounding areas of the tops. As a result, an upper electrode and a lower electrode come into contact with each other to cause short-circuiting, reducing the voltage generated by the solar cell.

In light of these circumstances, the inventors of the present disclosure have found a perovskite solar cell having a high voltage and including a photoelectric conversion layer on a surface having an uneven structure.

EMBODIMENTS OF PRESENT DISCLOSURE

Embodiments of the present disclosure will be described below in detail with reference to the drawings.

First Embodiment

Figure 1B:
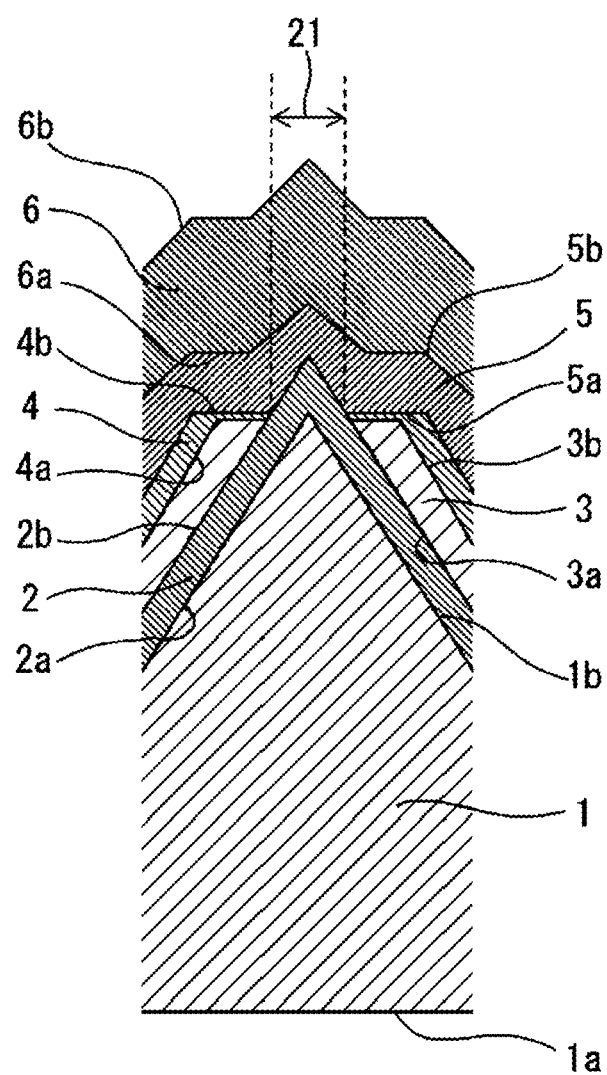
FIG. 1B is an enlarged cross-sectional view of a first region of the solar cell according to the first embodiment.
Figure 1C:
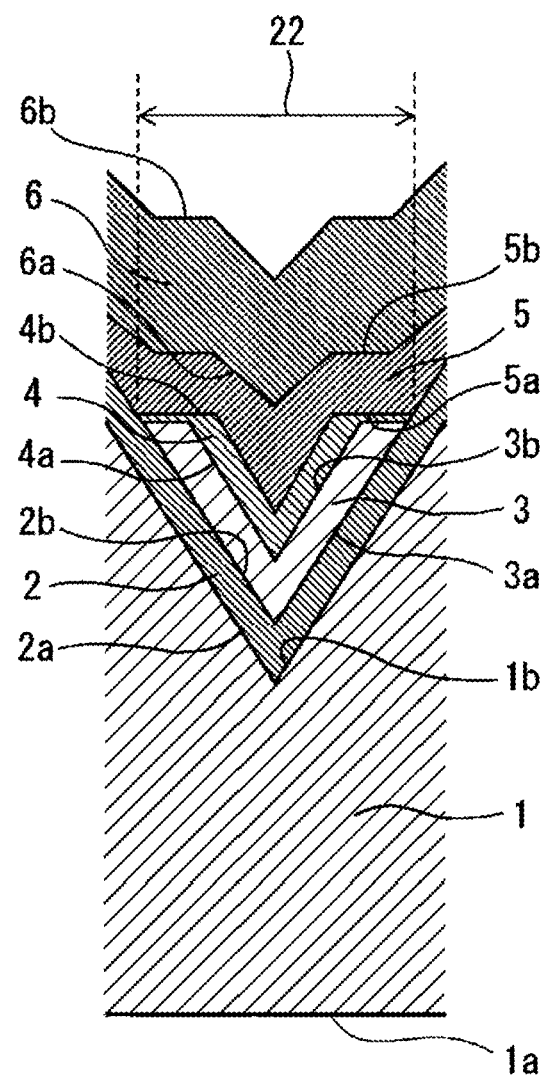
FIG. 1C is an enlarged cross-sectional view of a second region of the solar cell according to the first embodiment.

FIG. 1A is a cross-sectional view of a solar cell 100 according to a first embodiment. FIG. 1B is an enlarged cross-sectional view of a first region 21 of the solar cell 100 according to the first embodiment. FIG. 1C is an enlarged cross-sectional view of a second region 22 of the solar cell 100 according to the first embodiment.

Referring to FIG. 1A, the solar cell 100 according to this embodiment includes a substrate 1, an electron transport layer 2, a first photoelectric conversion layer 3, a hole transport layer 4, a coating layer 5, and a first electrode 6. The first photoelectric conversion layer 3 is disposed between the substrate 1 and the first electrode 6. Specifically, the substrate 1, the electron transport layer 2, the first photoelectric conversion layer 3, the hole transport layer 4, the coating layer 5, and the first electrode 6 are disposed in this order. The solar cell 100 also has regions in which the substrate 1, the electron transport layer 2, the coating layer 5, and the first electrode 6 are disposed in this order. In other words, the solar cell 100 has regions in which the electron transport layer 2 is not covered by the first photoelectric conversion layer 3 or the hole transport layer 4. The first photoelectric conversion layer 3 contains a perovskite compound. The coating layer 5 contains an oxide semiconductor. The solar cell 100 may not include the hole transport layer 4. The components of the solar cell 100 will be described below in detail, including the distinction between regions.

Referring to FIGS. 1B and 1C, the substrate 1 has a first main surface 1a and a second main surface 1b. The electron transport layer 2 has a first main surface 2a and a second main surface 2b. The first photoelectric conversion layer 3 has a first main surface 3a and a second main surface 3b. The hole transport layer 4 has a first main surface 4a and a second main surface 4b. The coating layer 5 has a first main surface 5a and a second main surface 5b. The first electrode 6 has a first main surface 6a and a second main surface 6b. In FIG. 1A to FIG. 1C, the first main surface of each component corresponds to a lower surface, and the second main surface corresponds to an upper surface.

The second main surface 1b of the substrate 1 faces the first main surface 2a of the electron transport layer 2. The second main surface 2b of the electron transport layer 2 faces the first main surface 3a of the first photoelectric conversion layer 3.

The second main surface 1b of the substrate 1 has an uneven structure. The first main surface 2a and the second main surface 2b of the electron transport layer 2 each have an uneven structure.

The first region 21 of the solar cell 100 corresponds to a region of the second main surface 2b of the electron transport layer 2 that is not covered by the first photoelectric conversion layer 3. The first region 21 of the second main surface 2b of the electron transport layer 2 is covered by the coating layer 5. The coating layer 5 can prevent short-circuiting caused by contact between the first electrode 6 and the electron transport layer 2 in the solar cell 100 according to the first embodiment. This configuration allows the solar cell 100 according to the first embodiment to have a high voltage. The first photoelectric conversion layer 3 is hardly formed on the top of a protrusion in the uneven structure of the second main surface 2b of the electron transport layer 2. The first region 21 thus includes, for example, the top of a protrusion in the uneven structure of the second main surface 2b of the electron transport layer 2.

Specifically, the enlarged view of the first region 21 of the solar cell 100 in FIG. 1B illustrates a protrusion on the second main surface 1b of the substrate 1 having an uneven structure and the second main surface 2b of the electron transport layer 2, and the surrounding area of the protrusion. The structure of the solar cell 100 in FIG. 1B will be described below in detail. As described above, the second main surface 1b of the substrate 1 has an uneven structure. The second main surface 1b of the substrate 1 is in contact with the first main surface 2a of the electron transport layer 2. The second main surface 2b of the electron transport layer 2 is covered by the coating layer 5 and in contact with the first main surface 5a of the coating layer 5. The second main surface 5b of the coating layer 5 is in contact with the first main surface 6a of the first electrode 6. A layer having another function may be disposed in at least one of a space between the second main surface 1b of the substrate 1 and the first main surface 2a of the electron transport layer 2 or a space between the second main surface 5b of the coating layer 5 and the first main surface 6a of the first electrode 6.

The second region 22 of the solar cell 100 corresponds to a region of the second main surface 2b of the electron transport layer 2 other than the first region 21, that is, a region covered by the first photoelectric conversion layer 3. The second region 22 includes, for example, the bottom of a recess in the uneven structure of the second main surface 2b of the electron transport layer 2. On the second region of the electron transport layer 2, the first photoelectric conversion layer 3 and the hole transport layer 4 may be disposed in this order, or the first photoelectric conversion layer 3, the hole transport layer 4, and the coating layer 5 may be disposed in this order.

Specifically, the enlarged view of the second region 22 of the solar cell 100 in FIG. 1C illustrates a recess of the second main surface 1b of the substrate 1 having an uneven structure and the second main surface 2b of the electron transport layer 2, and the surrounding area of the recess. The structure of the solar cell 100 in FIG. 1C will be described below in detail. As described above, the second main surface 1b of the substrate 1 has an uneven structure. The second main surface 1b of the substrate 1 is in contact with the first main surface 2a of the electron transport layer 2. The second main surface 2b of the electron transport layer 2 is in contact with the first main surface 3a of the first photoelectric conversion layer 3. The second main surface 3b of the first photoelectric conversion layer 3 is in contact with the first main surface 4a of the hole transport layer 4. The second main surface 4b of the hole transport layer 4 is in contact with the first main surface 5a of the coating layer 5. The second main surface 5b of the coating layer 5 is in contact with the first main surface 6a of the first electrode 6. A layer having another function may be disposed in at least one of a space between the second main surface 1b of the substrate 1 and the first main surface 2a of the electron transport layer 2, a space between the second main surface 2b of the electron transport layer 2 and the first main surface 3a of the first photoelectric conversion layer 3, a space between the second main surface 3b of the first photoelectric conversion layer 3 and the first main surface 4a of the hole transport layer 4, or a space between the second main surface 5b of the coating layer 5 and the first main surface 6a of the first electrode 6. In other words, the second main surface 1b of the substrate 1 and the first main surface 2a of the electron transport layer 2 face each other and are not necessarily in contact with each other. The second main surface 2b of the electron transport layer 2 and the first main surface 3a of the first photoelectric conversion layer 3 face each other and are not necessarily in contact with each other. The second main surface 3b of the first photoelectric conversion layer 3 and the first main surface 4a of the hole transport layer 4 face each other and are not necessarily in contact with each other. In addition, the second main surface 5b of the coating layer 5 and the first main surface 6a of the first electrode 6 face each other and are not necessarily in contact with each other. Examples of the "layer having another function" include a porous layer.

The "uneven structure" as used herein refers to surface unevenness that is observed in the cross-sectional STEM image and in which an average difference in height between protrusions and recesses exceeds 0.1 μm. The average difference in height between protrusions and recesses is determined as described below. First, an arbitrary region with a length of 20 μm is selected from the cross-sectional STEM image. Next, differences in height between protrusions and recesses adjacent to each other are all measured for the surface unevenness of the region. The average difference in height is calculated from the measured values. The average difference in height between protrusions and recesses is determined accordingly.

Figure 2A:
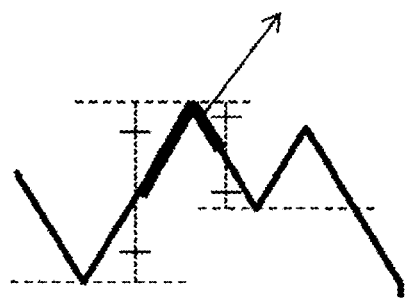
FIG. 2A is a view for describing a protrusion of the uneven structure in the solar cell according to the first embodiment.
Figure 2B:
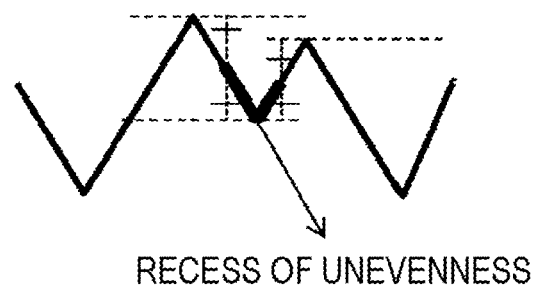
FIG. 2B is a view for describing a recess of the uneven structure in the solar cell according to the first embodiment.

Next, the "protrusions" and the "recesses" of the uneven structure in this specification will be described. FIG. 2A is a view for describing a protrusion of the uneven structure in the solar cell 100 according to the first embodiment. FIG. 2B is a view for describing a recess of the uneven structure in the solar cell 100 according to the first embodiment. The protrusion refers to the top of a protrusion shape of the uneven structure and the surrounding area of the top as illustrated in FIG. 2A. The surrounding area of the top is, for example, a region at and above the midpoints between the top and the bottoms of the adjacent recess shapes. The recess refers to the bottom of a recess shape of the uneven structure and the surrounding area of the bottom as illustrated in FIG. 2B. The surrounding area of the bottom of the recess shape is, for example, a region at and below the midpoints between the bottom of the recess shape and the tops of the adjacent protrusion shapes.

In FIG. 1A to FIG. 1C, the second main surface 5b of the coating layer 5 and the first main surface 6a and the second main surface 6b of the first electrode 6 have an uneven structure but may have a flat structure. Being flat means that the average difference in height of the surface unevenness observed in the cross-sectional STEM image is smaller than or equal to 0.1 μm.

In FIG. 1A to FIG. 1C, the second main surface 1b of the substrate 1 is flat but may have an uneven structure. In FIG. 1A, the first photoelectric conversion layer 3 does not cover the tops of all of the protrusions of the electron transport layer 2, but the tops of some of the protrusions may be covered by the first photoelectric conversion layer 3. The first main surface and the second main surface of each layer may have the same surface roughness or may have different surface roughness.

Each layer will be described below in detail.

Substrate 1

The substrate 1 is, for example, an electrode having electrical conductivity. When the substrate 1 is an electrode, the electrode may or may not transmit light. At least one selected from the group consisting of the substrate 1 and the first electrode 6 transmits light. The substrate 1 holds the electron transport layer 2, the first photoelectric conversion layer 3, the hole transport layer 4, the coating layer 5, and the first electrode 6. When the substrate 1 functions as an electrode, the substrate 1 may include an electrically conductive layer on a base formed of a non-electrically conductive material. In this case, the base formed of a non-electrically conductive material may be transparent.

The light transmitting electrode may transmit light in the visible to near-infrared regions. The light transmitting electrode may be formed of a transparent and electrically conductive material.

Examples of such a material include:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one of boron, aluminum, gallium, or indium; and (vii) composites thereof.

The light transmitting electrode may be formed of a non-transparent material so as to have a pattern through which light passes. Examples of the pattern through which light passes include linear patterns, wavy patterns, lattice patterns, and punched metal patterns having many fine through-holes arranged regularly or irregularly. When the light transmitting electrode has such a pattern, light can pass through areas with no electrode material. Examples of the non-transparent material include platinum, gold, silver, copper, aluminum, rhodium, indium, titanium, iron, nickel, tin, zinc, and alloys containing any one of these metals. The non-transparent material may be an electrically conductive carbon material.

Since the solar cell 100 includes the electron transport layer 2 between the first photoelectric conversion layer 3 and the substrate 1, the substrate 1 does not need to have an ability to block holes from the first photoelectric conversion layer 3. Therefore, the material of the substrate 1 may be a material that can be in ohmic contact with the first photoelectric conversion layer 3.

Electron Transport Layer 2

As described above, the electron transport layer 2 has the first main surface 2a and the second main surface 2b each having an uneven structure. When the electron transport layer 2 is formed on the second main surface 1b of the substrate 1, the uneven structure of the first main surface 2a and the uneven structure of the second main surface 2b may be formed so as to conform to the shape of the uneven structure of the second main surface 1b of the substrate 1. The first main surface 2a of the electron transport layer 2 faces the second main surface 1b of the substrate 1. The first main surface 1a of the electron transport layer 2 may be in contact with the second main surface 1b of the substrate 1.

As described above, the second main surface 2b of the electron transport layer 2 has the first region 21 and the second region 22. The first region 21 is not covered by the first photoelectric conversion layer 3 but covered by the coating layer 5. When the hole transport layer 4 is disposed, the first region 21 is not covered by the hole transport layer 4. The second region 22 is covered by the first photoelectric conversion layer 3.

The electron transport layer 2 transports electrons. The electron transport layer 2 contains a semiconductor. The electron transport layer 2 is preferably formed of a semiconductor having a band gap greater than or equal to 3.0 eV. The electron transport layer 2 formed of a semiconductor having a band gap greater than or equal to 3.0 eV allows visible light and infrared light to be transmitted to the first photoelectric conversion layer 3. Examples of the semiconductor include organic or inorganic n-type semiconductors.

Examples of the organic n-type semiconductors include imide compounds, quinone compounds, fullerene, and fullerene derivatives. Examples of the inorganic n-type semiconductors include metal oxides, metal nitrides, and perovskite oxides. Examples of the metal oxides include oxides of Cd, Zn, In, Pb, Mo, W, Sb, Bi, Cu, Hg, Ti, Ag, Mn, Fe, V, Sn, Zr, Sr, Ga, Si, or Cr. $TiO_2$ is preferred. Examples of the metal nitrides include GaN. Examples of the perovskite oxides include $SrTiO_3$, $CaTiO_3$, and $ZnTiO_3$.

The electron transport layer 2 may be formed of a substance having a band gap greater than 6.0 eV. Examples of the substance having a band gap greater than 6.0 eV include:

(i) halides of alkali metals or alkaline earth metals, such as lithium fluoride or barium fluoride; and (ii) oxides of alkaline earth metals, such as magnesium oxide.

In this case, the thickness of the electron transport layer 2 may be, for example, less than or equal to 10 nm in order to ensure the electron transport ability of the electron transport layer 2.

The electron transport layer 2 may include two or more layers made of different materials.

First Photoelectric Conversion Layer 3

The first photoelectric conversion layer 3 contains a perovskite compound. In other words, the first photoelectric conversion layer 3 contains, as a photoelectric conversion material, a perovskite compound composed of a monovalent cation, a divalent cation, and a halogen anion. The photoelectric conversion material is a light absorbing material.

In this embodiment, the perovskite compound may be represented by chemical formula $ABX_3$ (wherein A is a monovalent cation, B is a divalent cation, and X is a halogen anion).

In accordance with the expressions commonly used for perovskite compounds, A, B, and X are also respectively referred to as the A site, the B site, and the X site in this specification.

In the first embodiment, the perovskite compound may have a perovskite crystal structure represented by chemical formula $ABX_3$. For example, a monovalent cation is located at the A site, a divalent cation is located at the B site, and a halogen anion is located at the X site.

A Site

The monovalent cation located at the A site is not limited. Examples of the monovalent cation include organic cations and alkali metal cations. Examples of the organic cations include a methylammonium cation (i.e., $CH_3NH_3^+$), a formamidinium cation (i.e., $NH_2CHNH_2^+$), a phenylethylammonium cation (i.e., $C_6H_5C_2H_4NH_3^+$), and a guanidinium cation (i.e., $CH_6N_3^+$). Examples of the alkali metal cations include a cesium cation (i.e., $Cs^+$).

To improve the photoelectric conversion efficiency, the A site may include, for example, at least one selected from the group consisting of $Cs^+$, a formamidinium cation, and a methylammonium cation.

The cation at the A site may include two or more of the organic cations described above. The cation at the A site may include at least one of the organic cations described above and at least one of metal cations.

B Site

The divalent cation located at the B site is not limited. Examples of the divalent cation include divalent cations of the group 13 elements to the group 15 elements. For example, the B site includes a Pb cation, that is, $Pb^{2+}$.

X Site

The halogen anion located at the X site is not limited.

The X site may mainly include an iodide ion. The "halogen anion mainly includes an iodide ion" means that the ratio of the number of moles of iodide ions to the total number of moles of halogen anions is the highest. The X site may be substantially composed only of an iodide ion. The sentence "the X site is substantially composed only of an iodide ion" means that the ratio of the number of moles of iodide ions to the total number of moles of anions is greater than or equal to 90%, preferably greater than or equal to 95%.

The element, or ion, located at each of the A, B, and X sites may include two or more ions or may include one ion.

The first photoelectric conversion layer 3 may contain a material other than the photoelectric conversion material. For example, the first photoelectric conversion layer 3 may further contain a quencher substance for reducing the defect density of the perovskite compound. The quencher substance is a fluorine compound, such as tin fluoride. The molar ratio of the quencher substance to the photoelectric conversion material may be greater than or equal to 5% and less than or equal to 20%.

The first photoelectric conversion layer 3 may mainly contain a perovskite compound composed of a monovalent cation, a divalent cation, and a halogen anion.

The sentence "the first photoelectric conversion layer 3 mainly contains a perovskite compound composed of a monovalent cation, a divalent cation, and a halogen anion" means that the first photoelectric conversion layer 3 contains 70 mass % or more (preferably 80 mass % or more) of a perovskite compound composed of a monovalent cation, a divalent cation, and a halogen anion.

The first photoelectric conversion layer 3 may contain an impurity. The first photoelectric conversion layer 3 may further contain a compound other than the perovskite compound described above.

The first photoelectric conversion layer 3 may have a thickness greater than or equal to 100 nm and less than or equal to 10 μm, preferably a thickness greater than or equal to 100 nm and less than or equal to 1000 nm. The thickness of the first photoelectric conversion layer 3 depends on the amount of its light absorption.

The perovskite layer in the first photoelectric conversion layer 3 may be formed by using a solution coating method, a co-deposition method, or other methods.

The first photoelectric conversion layer 3 may have the first main surface 3a and the second main surface 3b each having an uneven structure. When the first photoelectric conversion layer 3 is formed on the second main surface 2b of the electron transport layer 2, the uneven structure of the first main surface 3a and the uneven structure of the second main surface 3b may be formed so as to conform to the shape of the uneven structure of the second main surface 2b of the electron transport layer 2.

The first photoelectric conversion layer 3 is in contact with the electron transport layer 2 described above or the hole transport layer 4 described below and may be partially mixed with the electron transport layer 2 or the hole transport layer 4. The first photoelectric conversion layer 3 may have, in the layer, a large area interface with the electron transport layer 2 or the hole transport layer 4.

Hole Transport Layer 4

The hole transport layer 4 contains a hole transport material. The hole transport material is a material that transports holes. Examples of the hole transport material include organic substances or inorganic semiconductors.

Examples of representative organic substances used as the hole transport material include 2,2',7,7'-tetrakis-(N,N-di-p-methoxyphenylamine)9,9'-spirobifluorene (hereinafter referred to as "spiro-OMeTAD"), poly[bis(4-phenyl)(2,4,6-trimethylphenyl)amine](hereinafter referred to as "PTAA"), poly(3-hexylthiophene-2,5-diyl) (hereinafter referred to as "P3HT"), poly(3,4-ethylenedioxythiophene) polystyrene sulfonate (hereinafter referred to as "PEDOT:PSS"), and copper phthalocyanine (hereinafter referred to as "CuPc").

The inorganic semiconductors are p-type semiconductors. Examples of the inorganic semiconductors include $Cu_2O$, $CuGaO_2$, CuSCN, CuI, $NiO_x$, $MoO_x$, $V_2O_5$, and carbon materials, such as graphene oxide.

The hole transport layer 4 may include two or more layers made of different materials.

The thickness of the hole transport layer 4 is preferably greater than or equal to 1 nm and less than or equal to 1000 nm, more preferably greater than or equal to 10 nm and less than or equal to 500 nm, still more preferably greater than or equal to 10 nm and less than or equal to 50 nm. When the hole transport layer 4 has a thickness greater than or equal to 1 nm and less than or equal to 1000 nm, the hole transport layer 4 can exhibit a sufficient hole transport ability. When the hole transport layer 4 has a thickness greater than or equal to 1 nm and less than or equal to 1000 nm, the hole transport layer 4 has low resistance and thus allows conversion of light into electricity at high efficiency.

The hole transport layer 4 may contain an additive and a solvent. The additive and the solvent have, for example, an effect of increasing the hole conductivity of the hole transport layer 4.

Examples of the additive include ammonium salts and alkali metal salts. Examples of the ammonium salts include tetrabutylammonium perchlorate, tetraethylammonium hexafluorophosphate, imidazolium salts, and pyridinium salts. Examples of the alkali metal salts include lithium bis(pentafluoroethanesulfonyl)imide, lithium bis(trifluoromethanesulfonyl)imide (hereafter referred to as "LiTFSI"), $LiPF_6$, $LiBF_4$, lithium perchlorate, and potassium tetrafluoroborate.

The solvent contained in the hole transport layer 4 may have high ion conductivity. The solvent may be an aqueous solvent or an organic solvent. To stabilize solutes, the solvent is preferably an organic solvent. Examples of the organic solvent include heterocyclic compounds, such as tert-butylpyridine (hereinafter referred to as "t-BP"), pyridine, and n-methylpyrrolidone.

The solvent contained in the hole transport layer 4 may be an ionic liquid. The ionic liquid may be used alone or as a mixture with another solvent. The ionic liquid is preferred because of its low volatility and high flame retardancy.

Examples of the ionic liquid include imidazolium compounds, such as 1-ethyl-3-methylimidazolium tetracyanoborate, pyridine compounds, alicyclic amine compounds, aliphatic amine compounds, and azonium amine compounds.

The hole transport layer 4 can be formed by various known coating methods or printing methods. Examples of coating methods include a doctor blade method, a bar coating method, a spraying method, a dip coating method, and a spin coating method. Examples of printing methods include a screen printing method.

Coating Layer 5

As described above, the coating layer 5 covers the first region 21 of the second main surface 2b of the electron transport layer 2. The coating layer 5 contains an oxide semiconductor. The oxide semiconductor may be at least one selected from the group consisting of tungsten oxide, molybdenum oxide, copper oxide, nickel oxide, and vanadium oxide.

The coating layer 5 can prevent short-circuiting caused by contact between the first electrode 6 and the electron transport layer 2 in the solar cell 100 according to the first embodiment. In the solar cell 100 according to the first embodiment, the first photoelectric conversion layer 3 is thus formed on the second main surface 2b of the electron transport layer 2 having an uneven structure. Therefore, even when some or all of the protrusions of the electron transport layer 2 are not covered by the first photoelectric conversion layer 3, the coating layer 5 prevents contact between the first electrode 6 and the electron transport layer 2 to avoid short-circuiting, so that the solar cell 100 according to the first embodiment achieves high voltage.

The coating layer 5 preferably has a band gap wide enough to inhibit ohmic contact between the first electrode 6 and the electron transport layer 2.

The coating layer 5 may also be disposed on the second region 22 of the second main surface 2b of the electron transport layer 2 with the first photoelectric conversion layer 3 and the hole transport layer 4 therebetween. In this case, the coating layer 5 preferably has an hole transport ability.

The coating layer 5 may contain at least one selected from the group consisting of tungsten oxide and molybdenum oxide. The coating layer 5 containing at least one selected from the group consisting of tungsten oxide and molybdenum oxide can assuredly prevent short-circuiting between the first electrode 6 and the electron transport layer and has a preferable hole transport ability. Having the coating layer 5 with such a configuration, the solar cell 100 thus achieves a higher voltage.

To increase the voltage of the solar cell 100, the coating layer 5 may have a thickness greater than or equal to 5 nm and less than or equal to 40 nm. Preferably, the coating layer 5 may have a thickness greater than or equal to 5 nm and less than or equal to 30 nm.

First Electrode 6

The first electrode 6 may or may not transmit light. At least one selected from the group consisting of the substrate 1 and the first electrode 6 transmits light.

When the first electrode 6 transmits light, the first electrode 6 may transmit light in the visible to near-infrared regions. The light transmitting electrode may be formed of a transparent and electrically conductive material.

Examples of such a material include:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one of boron, aluminum, gallium, or indium; and (vii) composites thereof.

The light transmitting electrode may be formed of a non-transparent material so as to have a pattern through which light passes. Examples of the pattern through which light passes include linear patterns, wavy patterns, lattice patterns, and punched metal patterns having many fine through-holes arranged regularly or irregularly. When the light transmitting electrode has such a pattern, light can pass through areas with no electrode material. Examples of the non-transparent material include platinum, gold, silver, copper, aluminum, rhodium, indium, titanium, iron, nickel, tin, zinc, and alloys containing any one of these metals. The non-transparent material may be an electrically conductive carbon material.

When the solar cell 100 includes no hole transport layer 4, the first electrode 6 may be formed of, for example, a material having an ability to block electrons from the first photoelectric conversion layer 3. In this case, the first electrode 6 is not in ohmic contact with the first photoelectric conversion layer 3. The ability to block electrons from the first photoelectric conversion layer 3 refers to the ability to allow only holes generated in the first photoelectric conversion layer 3 to pass through and prevent electrons from passing through. The Fermi energy of the material having an ability to block electrons is lower than the energy level at the lower end of the conduction band of the first photoelectric conversion layer 3. The Fermi energy of the material having an ability to block electrons may be lower than the Fermi energy level of the first photoelectric conversion layer 3. Examples of the material having an ability to block electrons include carbon materials, such as graphene.

When the solar cell 100 has the hole transport layer 4 between the first photoelectric conversion layer 3 and the first electrode 6, the first electrode 6 does not need to have an ability to block electrons from the first photoelectric conversion layer 3. In this case, the first electrode 6 may be in ohmic contact with the first photoelectric conversion layer 3.

The material having an ability to block electrons from the first photoelectric conversion layer 3 may not transmit light. When the first electrode 6 is formed of such a material, the first electrode 6 has the above pattern such that light passes through the first electrode 6.

The first electrode 6 may have a light transmittance greater than or equal to 50%, or greater than or equal to 80%. The wavelength of light transmitted through the first electrode 6 depends on the absorption wavelength of the first photoelectric conversion layer 3. The first electrode 6 has a thickness in the range of, for example, 1 nm or greater and 1000 nm or less.

Layer Having Another Function

An example of the "layer having another function" is a porous layer. The porous layer is located, for example, between the electron transport layer 2 and the first photoelectric conversion layer 3. The porous layer includes a porous material. The porous material includes pores. The pores in the porous layer located between the electron transport layer 2 and the first photoelectric conversion layer 3 may be connected to one another from areas in contact with the electron transport layer 2 to areas in contact with the first photoelectric conversion layer 3. The pores are typically filled with the material of the first photoelectric conversion layer 3. The electrons may directly move from the first photoelectric conversion layer 3 to the electron transport layer 2.

The porous layer may serve as a base for forming the first photoelectric conversion layer 3 on the substrate 1 and the electron transport layer 2. The porous layer does not inhibit the light absorption of the first photoelectric conversion layer 3 and the movement of electrons from the first photoelectric conversion layer 3 to the electron transport layer 2.

The porous material that may constitute the porous layer is composed of, for example, insulator or semiconductor particles connected to one another. Examples of the insulator particles include aluminum oxide particles and silicon oxide particles. Examples of the semiconductor particles include inorganic semiconductor particles. Examples of the inorganic semiconductor include oxides of metal elements, perovskite oxides of metal elements, sulfides of metal elements, and metal chalcogenides. Examples of the oxides of metal elements include oxides of metal elements, such as Cd, Zn, In, Pb, Mo, W, Sb, Bi, Cu, Hg, Ti, Ag, Mn, Fe, V, Sn, Zr, Sr, Ga, Si, and Cr. Specific examples of the oxides of metal elements include $TiO_2$. Examples of the perovskite oxides of metal elements include $SrTiO_3$, $CaTiO_3$, and $ZnTiO_3$. Examples of the sulfides of metal elements include CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenides include CdSe, $In_2Se_3$, $WSe_2$, HgS, PbSe, and CdTe.

The porous layer may have a thickness greater than or equal to 0.01 μm and less than or equal to 10 μm, or a thickness greater than or equal to 0.1 μm and less than or equal to 1 μm. The porous layer may have large surface roughness. Specifically, the surface-roughness coefficient of the porous layer given by the effective area/projected area may be greater than or equal to 10, or may be greater than or equal to 100. The projected area is the area of the shadow behind an object when the object is exposed to light from the front surface. The effective area is the actual surface area of the object. The effective area can be calculated from the volume of the object determined by the projected area and thickness of the object, and the specific surface area and bulk density of the material of the object.

Operation and Effect of Solar Cell 100

Next, the basic operation and effect of the solar cell 100 will be described. In the solar cell 100, at least one selected from the group consisting of the substrate 1 and the first electrode 6 transmits light. Light enters the solar cell 100 from the light transmitting surface. Upon exposure of the solar cell 100 to light, the first photoelectric conversion layer 3 absorbs light to generate excited electrons and holes. The excited electrons move to the electron transport layer 2. The holes generated in the first photoelectric conversion layer 3 move to the hole transport layer 4. The electron transport layer 2 and the hole transport layer 4 are electrically connected to the substrate 1 and the first electrode 6, respectively. The current is drawn from the substrate 1 and the first electrode 6. The substrate 1 and the first electrode 6 function as a negative electrode and a positive electrode, respectively. The hole transport layer 4 and the electron transport layer 2 may be inverted in the light incident direction.

Example of Method for Producing Solar Cell 100

The solar cell 100 can be produced by, for example, the following method.

First, an electrode having an uneven structure on at least one main surface (i.e., second main surface 1b) is prepared as the substrate 1. Next, the electron transport layer 2 is formed on the second main surface 1b of the substrate 1 by using a sputtering method or a spray pyrolysis method. The first photoelectric conversion layer 3 is formed on the electron transport layer 2 by using a coating method, such as a spin coating method, a die coating method, or an inkjet method. The hole transport layer 4 is formed on the first photoelectric conversion layer 3 by using a coating method, such as a spin coating method, a die coating method, or an inkjet method. The coating layer 5 is formed on the hole transport layer 4 by a vacuum heating deposition method. Finally, the first electrode 6 is formed on the coating layer 5 by a sputtering method.

Second Embodiment

Figure 3A:
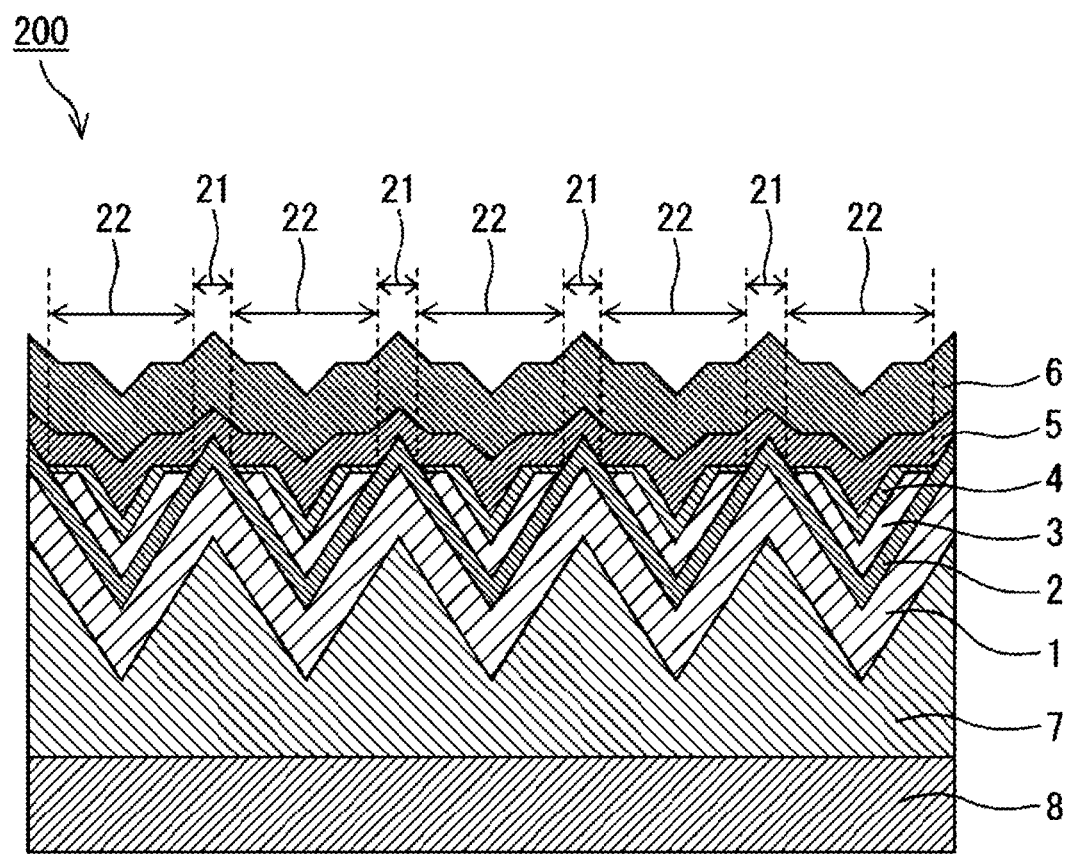
FIG. 3A is a cross-sectional view of a solar cell according to a second embodiment.
Figure 3B:
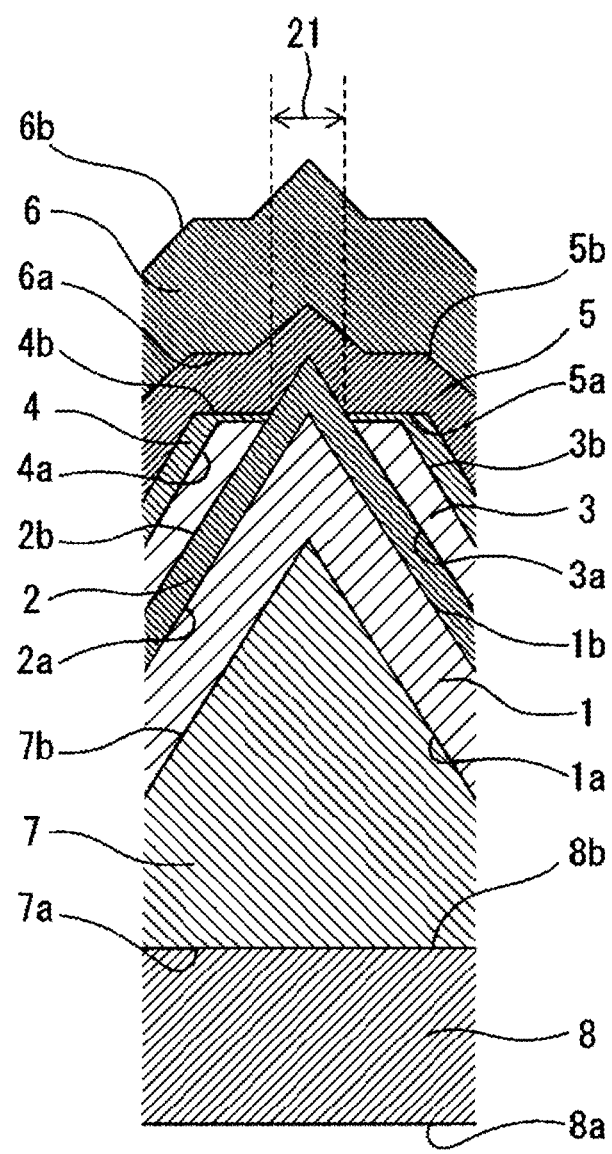
FIG. 3B is an enlarged cross-sectional view of a first region of the solar cell according to the second embodiment.
Figure 3C:
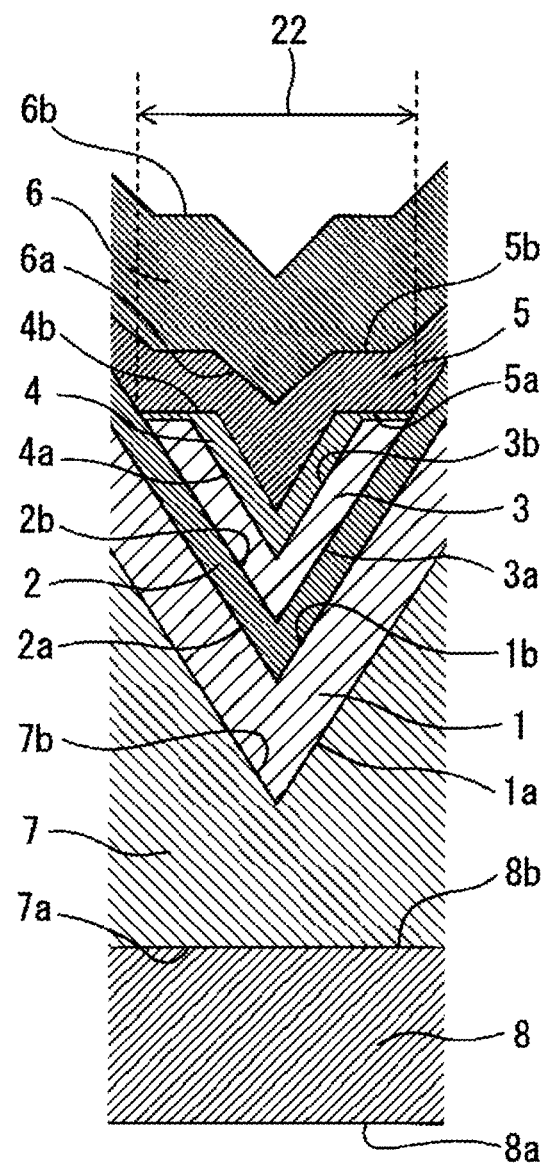
FIG. 3C is an enlarged cross-sectional view of a second region of the solar cell according to the second embodiment.

FIG. 3A is a cross-sectional view of a solar cell 200 according to a second embodiment. FIG. 3B is an enlarged cross-sectional view of a first region 21 of the solar cell 200 according to the second embodiment. FIG. 3C is an enlarged cross-sectional view of a second region 22 of the solar cell 200 according to the second embodiment.

Referring to FIG. 3A, the solar cell 200 according to the second embodiment differs from the solar cell 100 according to the first embodiment in that the solar cell 200 further includes a second photoelectric conversion layer 7 and a second electrode 8. In other words, the solar cell 200 is a multi-junction solar cell including two photoelectric conversion layers. The second photoelectric conversion layer 7 faces a first main surface 1a of a substrate 1. In other words, the second photoelectric conversion layer 7 is disposed below the substrate 1. In other words, the second photoelectric conversion layer 7 is disposed between the second electrode 8 and the substrate 1. The second photoelectric conversion layer 7 has a first main surface 7a and a second main surface 7b. The second electrode 8 has a first main surface 8a and a second main surface 8b. In FIG. 3A to FIG. 3C, the first main surface of each component corresponds to a lower surface, and the second main surface corresponds to an upper surface, as in FIG. 1A to FIG. 1C.

The solar cell 200 according to the second embodiment includes the substrate 1, an electron transport layer 2, a first photoelectric conversion layer 3, a hole transport layer 4, a coating layer 5, a first electrode 6, the second photoelectric conversion layer 7, and the second electrode 8. Specifically, the second electrode 8, the second photoelectric conversion layer 7, the substrate 1, the electron transport layer 2, the first photoelectric conversion layer 3, the hole transport layer 4, the coating layer 5, and the first electrode 6 are disposed in this order. The solar cell 200 also has regions in which the second electrode 8, the second photoelectric conversion layer 7, the substrate 1, the electron transport layer 2, the coating layer 5, and the first electrode 6 are disposed in this order. In other words, like the solar cell 100, the solar cell 200 has regions in which the electron transport layer 2 is not covered by the first photoelectric conversion layer 3 or the hole transport layer 4.

The structure of the solar cell 200 will be described below in detail.

Specifically, the enlarged view of the first region 21 of the solar cell 200 in FIG. 3B illustrates a protrusion on the second main surface 1b of the substrate 1 having an uneven structure and the second main surface 2b of the electron transport layer 2, and the surrounding area of the protrusion.

As illustrated in FIG. 3B, the second main surface 8b of the second electrode 8 is in contact with the first main surface 7a of the second photoelectric conversion layer 7. In addition, the second main surface 7b of the second photoelectric conversion layer 7 is in contact with the first main surface 1a of the substrate 1. The first main surface 7a and the second main surface 7b of the second photoelectric conversion layer 7 each have an uneven structure. Each layer above the substrate 1 has the same configuration as the corresponding layer in the solar cell 100 according to the first embodiment. A layer having another function may be disposed in each of spaces between the second main surface 8b of the second electrode 8 and the first main surface 7a of the second photoelectric conversion layer 7 and between the second main surface 7b of the second photoelectric conversion layer 7 and the first main surface 1a of the substrate 1.

The second main surface 7b of the second photoelectric conversion layer 7 faces the first main surface 1a of the substrate 1 and is not necessarily in contact with the first main surface 1a of the substrate 1. Examples of the layer having another function include a porous layer.

The configurations different from those of the solar cell 100 according to the first embodiment will be described below.

Substrate 1

In a multi-junction solar cell like the solar cell 200, the substrate 1 is, for example, a recombination layer. The recombination layer has a function of incorporating carriers generated in the first photoelectric conversion layer 3 and the second photoelectric conversion layer 7 and recombining the carriers. Therefore, the recombination layer preferably has a certain degree of conductivity.

The recombination layer may, for example, transmit light. The light transmitting recombination layer may transmit light in the visible to near-infrared regions. The light transmitting recombination layer may be formed of a transparent and electrically conductive material.

Examples of such a material include:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one of boron, aluminum, gallium, or indium; and (vii) composites thereof.

Examples of the material of the recombination layer include metal oxides, such as ZnO, $WO_3$, $MoO_3$, and $MoO_2$, and electron-accepting organic compounds. Examples of the electron-accepting organic compounds include organic compounds having a CN group as a substituent. Examples of the organic compounds having a CN group as a substituent include triphenylene derivatives, tetracyanoquinodimethane derivatives, and indenofluorene derivatives. Examples of the triphenylene derivatives include hexacyanohexaazatriphenylene. Examples of the tetracyanoquinodimethane derivatives include tetrafluoroquinodimethane and dicyanoquinodimethane. The electron-accepting substance may be used alone or as a mixture with another organic compound.

Second Photoelectric Conversion Layer 7

The photoelectric conversion material used for the second photoelectric conversion layer 7 has a smaller band gap than the photoelectric conversion material used for the first photoelectric conversion layer 3. Examples of the photoelectric conversion material used for the second photoelectric conversion layer 7 include silicon, perovskite compounds, chalcopyrite compounds, such as CIGS, and III-V group compounds, such as GaAs. The second photoelectric conversion layer 7 may contain silicon. When the second photoelectric conversion layer 7 contains silicon, the solar cell 200 is a multi-junction solar cell including a silicon solar cell and a perovskite solar cell stacked on top of each other. The photoelectric conversion material used for the second photoelectric conversion layer 7 is not limited to those as described above as long as it has a smaller band gap than the photoelectric conversion material used for the first photoelectric conversion layer 3.

Second Electrode 8

The second electrode 8 may or may not transmit light. At least one selected from the group consisting of the second electrode 8 and the first electrode 6 transmits light.

The light transmitting electrode may transmit light in the visible to near-infrared regions. The light transmitting electrode may be formed of a transparent and electrically conductive material.

Examples of such a material include:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one of boron, aluminum, gallium, or indium; and (vii) composites thereof.

The light transmitting electrode may be formed of a non-transparent material so as to have a pattern through which light passes. Examples of the pattern through which light passes include linear patterns, wavy patterns, lattice patterns, and punched metal patterns having many fine through-holes arranged regularly or irregularly. When the light transmitting electrode has such a pattern, light can pass through areas with no electrode material. Examples of the non-transparent material include platinum, gold, silver, copper, aluminum, rhodium, indium, titanium, iron, nickel, tin, zinc, and alloys containing any one of these metals. The non-transparent material may be an electrically conductive carbon material.

The second electrode 8 may have a light transmittance greater than or equal to 50%, or greater than or equal to 80%. The wavelength of light transmitted through the second electrode 8 depends on the absorption wavelength of the second photoelectric conversion layer 7 and the first photoelectric conversion layer 3. The second electrode 8 has a thickness in the range of, for example, 1 nm or greater and 1000 nm or less.

Operation and Effect of Solar Cell 200

Next, the basic operation and effect of the solar cell 200 will be described. In the solar cell 200, at least one selected from the group consisting of the second electrode 8 and the first electrode 6 transmits light. When the first electrode 6 transmits light, for example, light enters the solar cell 200 from the surface of the first electrode 6 in the solar cell 200. Upon exposure of the solar cell 200 to light, the first photoelectric conversion layer 3 absorbs light to generate excited electrons and holes. The excited electrons move to the electron transport layer 2. The holes generated in the first photoelectric conversion layer 3 move to the hole transport layer 4. Light that is not absorbed by the first photoelectric conversion layer 3 passes through the electron transport layer 2 and the substrate 1 and is absorbed by the second photoelectric conversion layer 7. The second photoelectric conversion layer 7 generates excited electrons and holes when it absorbs light. The excited electrons move to the second electrode 8. The holes generated in the second photoelectric conversion layer 7 move to the substrate 1. The electrons that have moved from the first photoelectric conversion layer 3 to the substrate 1 and the holes that have moved from the second photoelectric conversion layer 7 to the substrate 1 are recombined in the substrate 1. The current is drawn from the second electrode 8 and the first electrode 6. The second electrode 8 and the first electrode 6 function as a negative electrode and a positive electrode, respectively.

Example of Method for Producing Solar Cell 200

The solar cell 200 can be produced by, for example, the following method.

First, an n-type silicon single crystal having an uneven structure on one main surface (i.e., a main surface corresponding to the second main surface 7b) is prepared as the second photoelectric conversion layer 7. Next, the second electrode 8 is formed on the first main surface 7a of the second photoelectric conversion layer 7 by using a sputtering method or a vacuum heating deposition method. The substrate 1 functioning as a recombination layer is formed on the second main surface 7b of the second photoelectric conversion layer 7 by using a sputtering method or a vacuum heating deposition method. The electron transport layer 2 is then formed on the second main surface 1b of the substrate 1 by using a sputtering method or a spray pyrolysis method. The first photoelectric conversion layer 3 is formed on the electron transport layer 2 by using a coating method, such as a spin coating method, a die coating method, or an inkjet method. The hole transport layer 4 is formed on the first photoelectric conversion layer 3 by using a coating method, such as a spin coating method, a die coating method, or an inkjet method. The coating layer 5 is formed on the hole transport layer 4 by a vacuum heating deposition method. Finally, the first electrode 6 is formed on the coating layer 5 by a sputtering method.

The solar cell 200 according to the second embodiment includes two photoelectric conversion layers. In other words, the solar cell 200 is a double-junction solar cell including two solar cells connected to each other. The number of connected solar cells is not limited to two, and three or more solar cells may be connected to each other.

EXAMPLES

The present disclosure will be described in more detail with reference to Examples below.

Example 1

In Example 1, the solar cell 100 illustrated in FIG. 1 is produced as described below. The elements of the solar cell 100 of Example 1 are as described below.

Substrate 1: a silicon substrate having a tin-doped indium oxide layer thereon and having a texture surface of 2.0 μm (i.e., the average difference in height between protrusions and recesses on the texture surface is 2.0 μm. it may be referred to as a "2.0 μm texture".)

Electron transport layer 2: a $TiO_2$ layer (thickness: 15 nm)

First photoelectric conversion layer 3: a layer mainly containing a perovskite compound $CH(NH_2)_2PbI_3$ Hole transport layer 4: a PTAA-containing layer (containing $LiN(SO_2CF_3)_2$ and 4-tert-butyl pyridine (hereinafter referred to as "t-BP") as an additive and a solvent, respectively)

Coating layer 5: a molybdenum oxide layer (thickness: 10 nm)

First electrode 6: a tin-doped indium oxide layer (thickness: 200 nm)

A specific production method is described below.

First, a silicon substrate having a tin-doped indium oxide layer on the surface and having a texture size of 2.0 μm was prepared as the substrate 1.

Next, a $TiO_2$ film having a thickness of 15 nm was formed as the electron transport layer 2 on the tin-doped indium oxide layer of the substrate 1 by a sputtering method.

Next, the first photoelectric conversion layer 3 was formed on the electron transport layer 2 by spin-coating a first material solution. The first material solution was a solution containing 0.92 mol/L of $PbI_2$ (available from Tokyo Chemical Industry Co., Ltd.), 0.17 mol/L of $PbBr_2$ (available from Tokyo Chemical Industry Co., Ltd.), 0.83 mol/L of formamidinium iodide (available from GreatCell Solar Limited) (hereinafter referred to as "FAI"), 0.17 mol/L of methylammonium bromide (available from GreatCell Solar Limited) (hereinafter referred to as "MABr"), and 0.05 mol/L of CsI (available from Iwatani Corporation). The solvent of the solution was a mixture of dimethyl sulfoxide (available from Acros Organics) and N,N-dimethylformamide (available from Acros Organics). The mixing ratio of dimethyl sulfoxide and N,N-dimethylformamide (dimethyl sulfoxide:N,N-dimethylformamide) in the first material solution was 1:4 (volume ratio).

Next, the hole transport layer 4 was formed on the first photoelectric conversion layer 3 by spin-coating a second material solution. The second material solution was a solution of 10 mg of PTAA (available from Aldrich Chemical Co. Inc.), 5 μL of t-BP (available from Aldrich Chemical Co. Inc.), and 4 μL of $LiN(SO_2CF_3)_2$ (available from Tokyo Chemical Industry Co., Ltd.) acetonitrile solution (concentration: 1.8 mol/L) in 1 mL of toluene (available from Acros Organics).

Next, a molybdenum oxide layer having a thickness of 10 nm was formed on the hole transport layer 4 by vacuum deposition at a degree of vacuum of $1.5 \times 10^{-5}$ Pa. The molybdenum oxide layer functioned as the coating layer 5.

Finally, a tin-doped indium oxide layer having a thickness of 200 nm was deposited on the coating layer 5 by a sputtering method. The tin-doped indium oxide layer functioned as the first electrode 6. Sputtering was performed by using an $In_2O_3$ target containing 10 wt % of $SnO_2$ under the conditions of a back pressure of $3.8 \times 10^{-4}$ Pa, a substrate-target distance of 100 mm, a substrate temperature of room temperature, a power of 60 W, a pressure of 0.5 Pa, and an oxygen concentration of 1%.

The solar cell 100 of Example 1 was produced accordingly. The processes described above other than the process for forming the first electrode 6 were carried out in a dry room in a dry atmosphere having a dew point lower than or equal to −40° C.

Example 2

A solar cell was produced by the same method as in Example 1 except for the following:
(i) A silicon substrate having a tin-doped indium oxide layer on the surface and having a texture surface of 0.6 μm (i.e., the average difference in height between protrusions and recesses on the texture surface was 0.6 μm. it may be referred to as a "0.6 μm texture".) was prepared as the substrate 1.

Example 3

A solar cell was produced by the same method as in Example 1 except for the following:
(i) Instead of molybdenum oxide, tungsten oxide having a thickness of 10 nm was formed as the coating layer 5 by vacuum deposition.

Example 4

A solar cell was produced by the same method as in Example 1 except for the following:
(i) A silicon substrate having a tin-doped indium oxide layer on the surface and having a texture surface of 0.6 μm (i.e., the average difference in height between protrusions and recesses on the texture surface was 0.6 μm. it may be referred to as a "0.6 μm texture".) was prepared as the substrate 1.
(ii) Instead of molybdenum oxide, tungsten oxide having a thickness of 10 nm was deposited as the coating layer 5 by vacuum deposition.

Comparative Example 1

A solar cell was produced by the same method as in Example 1 except for the following:
(i) No coating layer 5 was formed.

Comparative Example 2

A solar cell was produced by the same method as in Example 1 except for the following:
(i) A silicon substrate having a tin-doped indium oxide layer on the surface and having a texture surface of 0.6 μm (i.e., the average difference in height between protrusions and recesses on the texture surface was 0.6 μm.) was prepared as the substrate 1.
(ii) No coating layer 5 was formed.

Comparative Example 3

A solar cell was produced by the same method as in Example 1 except for the following:
(i) Instead of molybdenum oxide, copper phthalocyanine having a thickness of 10 nm was formed as the coating layer 5 by vacuum deposition.

Reference Example 1

A solar cell was produced by the same method as in Example 1 except for the following:
(i) A flat glass substrate having a tin-doped indium oxide layer on the surface (purchased from Geomatec Co., Ltd.) was prepared as the substrate 1.

Reference Example 2

A solar cell was produced by the same method as in Example 1 except for the following:
(i) A flat glass substrate having a tin-doped indium oxide layer on the surface (purchased from Geomatec Co., Ltd.) was prepared as the substrate 1.
(ii) Instead of molybdenum oxide, silicon dioxide having a thickness of 10 nm was formed as the coating layer 5 by a sputtering method.

Evaluation of Cross-Sectional Structure of Solar Cell

Figure 4A:
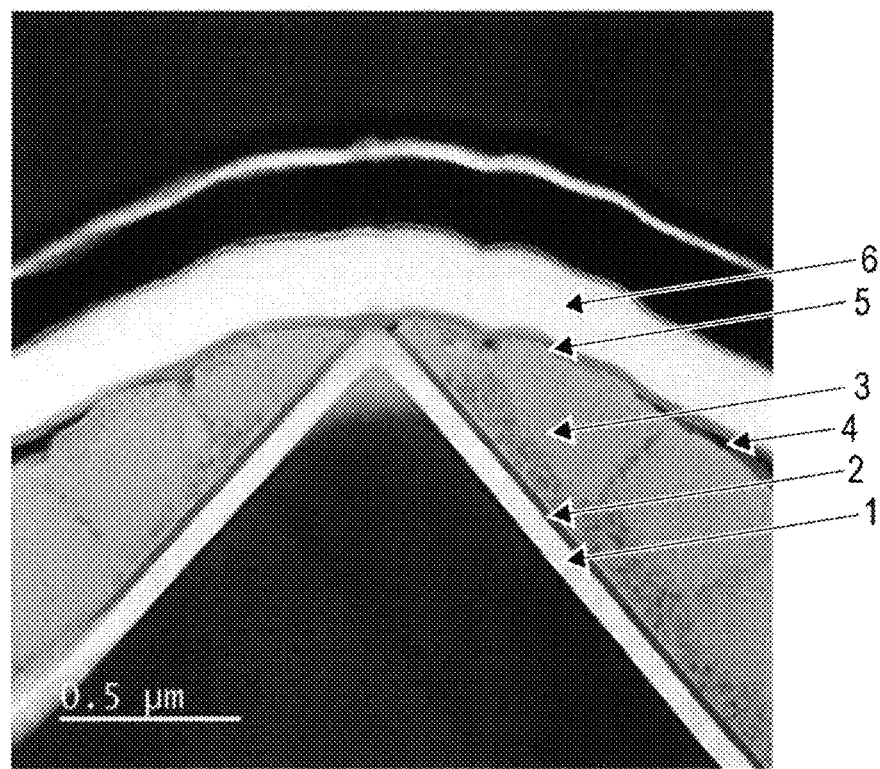
FIG. 4A is a dark field scanning transmission electron microscope (hereinafter referred to as "STEM") image of the cross section of a solar cell according to Example 1.
Figure 4B:
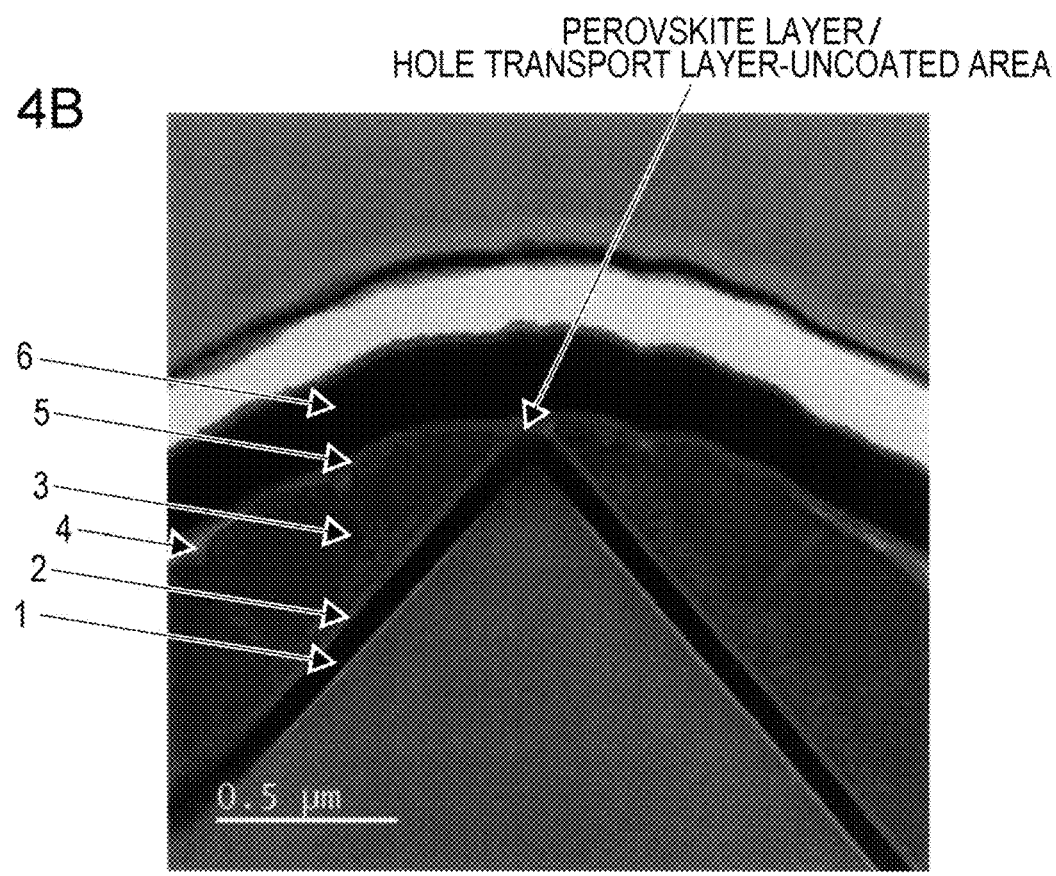
FIG. 4B is a bright field STEM image of the cross section of the solar cell according to Example 1.

The cross-sectional structure of the solar cell of Example 1 was evaluated. The cross-sectional structure of the produced solar cell of Example 1 was processed into a thin piece by using a focused ion beam system (NX5000 available from Hitachi High-Tech Science Corporation). The cross section of the solar cell of Example 1 was then analyzed by using a STEM (JEM-F200 available from JEOL Ltd.). The cross section was observed by using an electron beam with an acceleration voltage of 200 kV. FIG. 4A is a dark field STEM image of the cross section of the solar cell according to Example 1. FIG. 4B is a bright field STEM image of the cross section of the solar cell according to Example 1. As illustrated in FIG. 4A and FIG. 4B, the opposite surfaces of the electron transport layer 2 each had an uneven structure formed so as to conform to the uneven shape of the texture structure of the surface of the substrate 1. The first photoelectric conversion layer 3 formed on the electron transport layer 2 did not completely cover the electron transport layer 2. Regions of the electron transport layer 2 that included the tops of the protrusions on the second main surface 2b were the first regions not covered by the first photoelectric conversion layer 3. The coating layer 5 covered the first regions of the second main surface 2b of the electron transport layer 2. The coating layer 5 also covered the first photoelectric conversion layer 3 and the hole transport layer 4.

Elemental Mapping Images Analyzed from Cross-Sectional STEM Image

Figure 5:
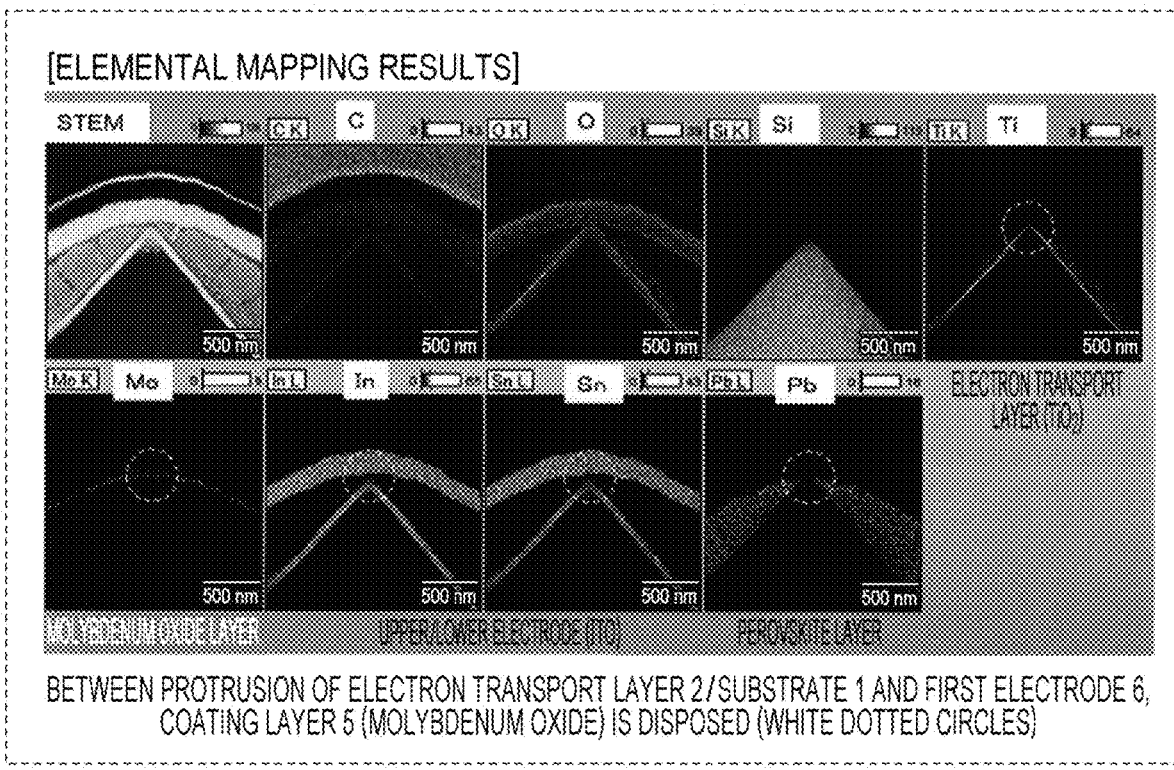
FIG. 5 illustrates elemental mapping images analyzed from the cross-sectional STEM image obtained in FIG. 4A.

The elemental mapping images were acquired by using an energy dispersive X-ray spectrometer (JED 2300T) attached to a scanning transmission electron microscope. The results are shown in FIG. 5.

Measurement of Solar Cell Characteristic (Voltage)

The open voltage of the solar cells of Examples 1 to 4, Comparative Examples 1 to 3, Reference Example 1, and Reference Example 2 was evaluated by a solar simulator (ALS440B available from BAS Inc.). The evaluation was carried out by using an artificial sunlight with an illumination of 100 mW/cm².

TABLE 1

| | Shape of Substrate 1 | Coating Layer 5 | Open Voltage (unit: mV) |
|---|---|---|---|
| Example 1 | 2.0 μm texture | molybdenum oxide | 953 |
| Example 2 | 0.6 μm texture | molybdenum oxide | 902 |
| Example 3 | 2.0 μm texture | tungsten oxide | 557 |
| Example 4 | 0.6 μm texture | tungsten oxide | 810 |
| Comparative Example 1 | 2.0 μm texture | none | 23 |
| Comparative Example 2 | 0.6 μm texture | none | 245 |
| Comparative Example 3 | 2.0 μm texture | copper phthalocyanine | 259 |
| Reference Example 1 | flat | molybdenum oxide | 1060 |
| Reference Example 2 | flat | silicon dioxide | 383 |

Discussion of Experimental Results

The solar cells of Examples 1 to 4 showed higher open voltages than the solar cells of Comparative Examples 1 and 2. The solar cells of Examples 1 to 4 included the first photoelectric conversion layer 3 on the surface having an uneven structure formed by using the substrate 1 having an uneven structure and had the coating layer 5 containing molybdenum oxide or tungsten oxide. The solar cells of Comparative Examples 1 and 2 had no coating layer 5. The solar cell according to Comparative Example 3 had the coating layer 5, but the coating layer 5 did not contain at least one selected from the group consisting of tungsten oxide, molybdenum oxide, copper oxide, nickel oxide, and vanadium oxide, and the coating layer 5 was formed of copper phthalocyanine. Therefore, the solar cell of Comparative Example 3 had a lower open voltage than the solar cells of Examples 1 to 4. The solar cells according to Reference Examples 1 and 2 use the flat substrate 1, and thus the first photoelectric conversion layer 3 is not disposed on a surface having an uneven structure. However, the results of Reference Examples 1 and 2 may indicate a difference in open voltage generated by a difference in the material of the coating layer 5. Comparison between the solar cells according to Reference Examples 1 and 2 both including the coating layer 5 reveals that the solar cell including the coating layer 5 formed of molybdenum oxide has a much higher open voltage than the solar cell including the coating layer 5 formed of silicon dioxide having no hole transport ability.

The cross-sectional STEM images in FIGS. 4A and 4B indicate, in a region including the top of the unevenness, the coating layer 5 prevents contact between the electron transport layer 2 on the substrate 1 and the first electrode 6.

FIG. 5 illustrates elemental mapping images (entire STEM image, C, O, Si, and Ti from the upper left in FIG. 5, and Mo, In, Sn, Pb from the bottom left in FIG. 5) acquired from the cross-sectional STEM image in FIG. 4A. The mapping images of C and Pb correspond to the first photoelectric conversion layer 3. The mapping image of Si corresponds to the substrate 1. The mapping image of Ti corresponds to the electron transport layer 2. The mapping images of In and Sn correspond to the first electrode 6.

In the region (indicated by the dotted circles in FIG. 5) including the top of a protrusion in the uneven structure of the substrate 1, the Ti element from $TiO_2$ of the electron transport layer 2 and the Mo element from molybdenum oxide of the coating layer 5 were observed. Molybdenum oxide of the coating layer 5 covers $TiO_2$ of the electron transport layer 2 on ITO of the substrate 1 to prevent contact between the electron transport layer 2 and the first electrode 6.

The solar cell according to the present disclosure is useful for, for example, a building-integrated solar cell.

What is claimed is:

1. A solar cell comprising:
    a substrate;
    a first electrode;
    an electron transport layer;
    a first photoelectric conversion layer; and
    a coating layer,
    wherein the first photoelectric conversion layer is disposed between the first electrode and the substrate,
    the substrate has a first main surface and a second main surface, and the second main surface of the substrate has an uneven structure,
    the electron transport layer has a first main surface and a second main surface, and the first main surface and the second main surface of the electron transport layer each have an uneven structure,
    the first photoelectric conversion layer has a first main surface and a second main surface,
    the second main surface of the substrate faces the first main surface of the electron transport layer,
    the second main surface of the electron transport layer faces the first main surface of the first photoelectric conversion layer,
    the second main surface of the electron transport layer has a first region not covered by the first photoelectric conversion layer and a second region covered by the first photoelectric conversion layer,
    the first photoelectric conversion layer contains a perovskite compound,
    the first region is covered by the coating layer, and
    the coating layer contains an oxide semiconductor.

2. The solar cell according to claim 1, wherein the oxide semiconductor is at least one selected from the group consisting of tungsten oxide, molybdenum oxide, copper oxide, nickel oxide, and vanadium oxide.

3. The solar cell according to claim 1, wherein the oxide semiconductor is at least one selected from the group consisting of tungsten oxide and molybdenum oxide.

4. The solar cell according to claim 1, wherein the first region includes a top of a protrusion in the uneven structure of the second main surface of the electron transport layer.

5. The solar cell according to claim 1, wherein the second region includes a bottom of a recess in the uneven structure of the second main surface of the electron transport layer.

6. The solar cell according to claim 1, wherein the coating layer has a thickness greater than or equal to 5 nm and less than or equal to 40 nm.

7. The solar cell according to claim 1, further comprising a hole transport layer between the first photoelectric conversion layer and the first electrode.

8. The solar cell according to claim 7, wherein the first photoelectric conversion layer and the hole transport layer are disposed in this order on the second region.

9. The solar cell according to claim 7, wherein the first photoelectric conversion layer, the hole transport layer, and the coating layer are disposed in this order on the second region.

10. The solar cell according to claim 7, wherein the hole transport layer contains poly[bis(4-phenyl)(2,4,6-trimethylphenyl)amine].

11. The solar cell according to claim 1, further comprising a second electrode and a second photoelectric conversion layer,
    wherein the second photoelectric conversion layer is disposed between the first main surface of the substrate and the second electrode.

12. The solar cell according to claim 11, wherein the second photoelectric conversion layer contains silicon.

13. The solar cell according to claim 11,
    wherein the second photoelectric conversion layer has a first main surface and a second main surface,
    the second main surface of the second photoelectric conversion layer has an uneven structure, and
    the second main surface of the second photoelectric conversion layer faces the first main surface of the substrate.

14. The solar cell according to claim 1, wherein the electron transport layer contains $TiO_2$.

* * * * *